United States Patent
Yang

(10) Patent No.: US 6,447,962 B2
(45) Date of Patent: Sep. 10, 2002

(54) METHOD FOR REPAIRING MOSI ATTENUATED PHASE SHIFT MASKS

(75) Inventor: Baorui Yang, Pflugerville, TX (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/871,684

(22) Filed: Jun. 4, 2001

Related U.S. Application Data

(63) Continuation of application No. 09/220,895, filed on Dec. 28, 1998, now Pat. No. 6,277,526.

(51) Int. Cl.[7] .................................................. G03F 9/00
(52) U.S. Cl. ..................... 430/5; 204/192.35; 250/492.2
(58) Field of Search ................. 430/5; 204/192.35; 250/492.2

(56) References Cited

U.S. PATENT DOCUMENTS

| | | |
|---|---|---|
| 4,851,097 A | 7/1989 | Hattori et al. |
| 5,085,957 A | 2/1992 | Hosono |
| 5,165,954 A | 11/1992 | Parker et al. |
| 5,272,116 A | 12/1993 | Hosono |
| 5,357,116 A | 10/1994 | Talbot et al. |
| 5,464,713 A * | 11/1995 | Yoshioka et al. ............... 430/5 |
| 5,629,114 A * | 5/1997 | Isao et al. ....................... 430/5 |
| 5,717,204 A | 2/1998 | Meisburger et al. |
| 5,853,922 A * | 12/1998 | Nakao ............................ 430/5 |
| 6,165,649 A * | 12/2000 | Grenon et al. ................. 430/5 |
| 6,277,526 B1 * | 8/2001 | Yang .............................. 430/5 |

OTHER PUBLICATIONS

Stark, T.J.; et al., $H_2O$ enhanced focused ion beam micromachining, J. Vac. Sci. Technol. B 13(6), Nov./Dec., 1995, pp. 2585–2569.

Satoh, Y., et al., Performance of gas assist FIB repair for opque defects, SPIE vol. 2884, 1996, pp. 124–137.

* cited by examiner

*Primary Examiner*—Kiet T. Nguyen
(74) *Attorney, Agent, or Firm*—Dickstein Shapiro Morin & Oshinsky LLP

(57) ABSTRACT

A method of repairing defects on a MoSi phase shifting template such as a mask or reticle that includes the steps of directing an ultraviolet light source over region of the template that includes an opaque defect. Clear defects caused by the removal of the opaque defect in the template are then repaired by a focused ion beam (FIB). The template may be exposed to a strongly basic solution to remove ion stains produced by the FIB. According to this method, the defect is removed with high edge placement accuracy and high quality of geometry reconstruction.

2 Claims, 5 Drawing Sheets

METHOD FOR REPAIRING MOSI ATTENUATED PHASE SHIFT MASKS

This application is a continuation of application Ser. No. 09/220,895 filed on Dec. 28, 1998, now U.S. Pat. No. 6,277,526, which is hereby incorporated herein by reference.

FIELD OF THE INVENTION

The present invention relates generally to a method for repairing a template used in optical lithography, and in particular to a method for repairing opaque defects on a phase shifting template, such as a mask or reticle, which is used in a lithographic process for the manufacture of semiconductor elements.

BACKGROUND OF THE INVENTION

Microlithography is used in the manufacture of semiconductor wafers to pattern various layers on a wafer. A layer of resist is deposited on the wafer and exposed using an exposure tool and a template such as a mask or reticle. During the exposure process a form of radiant energy such as ultraviolet light is directed through the template to selectively expose the resist in a desired pattern. The resist is then developed to remove either the exposed portions for a positive resist or the unexposed portions for a negative resist, thereby forming a resist mask on the wafer. The resist mask can then be used to protect underlying areas of the wafer during subsequent fabrication processes, such as deposition, etching, or ion implantation processes.

IC (Integrated Circuit) manufacturers have been trying to reduce the geometric size of the active devices (e.g., transistors, diodes, etc.) present in integrated circuits. The benefits achieved by reducing device dimensions include higher performance and smaller packaging sizes. Improving lithographic techniques provides improved resolution and results in a potential reduction of the minimum critical dimension due to the precision of the lithographic template. However, at small geometries, diffraction effects on the template such as proximity effects, poor subject contrast, and poor resolution result can result in wafers with incomplete or erroneous circuit patterns.

A lithographic technique useful at small geometries is known as phase shifting lithography. In phase shifting lithography, the interference between waves of an exposure energy is used to overcome diffraction effects and to improve the resolution and depth of optical images projected onto a target. Phase shifting lithography involves controlling the phase of an exposure light at the target such that adjacent bright areas are formed preferably 180 degrees out of phase with one another. Dark regions are thus produced between the bright areas by destructive interference even when diffraction would otherwise cause these areas to be lit. This technique improves total resolution at the target (i.e., wafer) and allows resolutions as fine as 0.10 microns to occur.

In the past, phase shifting templates have been used experimentally to print submicron features. Phase shifting lithography is still in the research and development stage, however, and has not been used extensively for commercial volume semiconductor manufacture. One reason phase shifting lithography is not widely used commercially is the high defect density which results during its manufacture. Phase shifting templates are difficult to form without defects and any defects on the template may be printed onto the target. In addition, an individual reticle costs up to $20,000 and typically requires up to two weeks to manufacture. Mask production likewise involves substantial time and expense. The complete circuit patterning for a modern IC will typically require 10 to 20 or more reticles.

The most common template defects are pattern distortions of two types: opaque defects and clear defects. Reticles and masks typically consist of a light absorbent thin film of metal or metal silicide, such as chromium or molybdenum silicide, deposited in a pattern on a transparent substrate of quartz, glass, or fused silica. Opaque defects, which may occur as spots, pattern extensions, bridges between adjacent patterns, or the like, are the result of opaque material such as chromium or molybdenum silicide being present in a non-pattern area. Clear defects, which generally occur as pinholes, missing parts, or breaks in the pattern, are the result of missing or inadequate layers of opaque material in a pattern area on the template.

Focused ion beams (FIBs) have been used for repair of optical masks and reticles since the mid-1980s. The ability of the FIB to accurately remove unwanted portions of the metal film and to deposit material to "edit" the pattern makes it potentially an almost ideal repair tool. A FIB exposes a template to a beam of positively charged ions, typically gallium ions, via an optic system. When a template is exposed to the ion beam, secondary ions are produced, and may be detected by the FIB machine and monitored to determine the progress of repair work. If a chromium pattern is exposed, secondary chromium ions are generated, and if a silicon, glass pattern or molybdenum silicide is exposed, secondary silicon ions are generated.

Sputtering with a scanning FIB has been the preferred method of opaque defect repair at small geometries, but FIB sputtering has several disadvantages. First, difficulty in precisely determining the endpoint when etching molybdenum silicide films leads to overetching and subsequent recess formation in the template substrate, which affects the phase shifting amount and may cause transmission error. Second, the high energy (25 to 50 KeV) FIB beams used cause significant template damage during repair due to the beam's high sputter rate. In addition, significant amounts of ions from the ion beam are implanted into the template substrate during imaging and opaque defect repair, resulting in an effect called "ion staining" or "gallium staining", when a gallium ion beam is used. This effect causes local reductions of the substrate's transparency which may print on the semiconductor wafer, and/or may be identified erroneously as defects by industry-standard mask inspection equipment.

The clear defects on a template have also traditionally been repaired on a focused ion beam (FIB) tool by carbon deposition. However, a carbon halo is often formed around the actual repair. The carbon halo can bridge the adjacent features causing the semiconductor formed using the mask to short out. In current production flows, the carbon halo present after clear repair is typically removed by a DRS II laser repair tool.

MoSi is one of the two best material candidates for use in making DUV (248 nm) phase shifting masks. The other material is CrO. One of the limiting factors in full scale use of the MoSi phase shifting mask is the present defect repair capability. The current FIB tool such as Seiko SIR-3000 provides high resolution imaging, but can only map the mask images using $Si^+$ and $Cr^+$ signals. A reasonably good image quality of the MoSi phase shifting mask can be obtained by collecting the $Si^+$ signals, therefore, the clear defect on a MoSi mask is repairable on the FIB tool. However, in order to repair the opaque MoSi defect, the machine, for example, Seiko SIR-3000, needs a $Mo^+$ detector for end-point detection, chemicals for chemical-assisted MoSi etching, and corresponding hardware and software supports. There is needed, therefore, improved methods for repairing defects on a phase shifting template.

SUMMARY OF THE INVENTION

The present invention provides a method for repairing defects on a lithographic template. The method includes repairing opaque and/or clear defects by the use of resist process or laser tools and focused ion beam sputtering. The method of repairing defects on a phase shifting template such as a mask or reticle includes removing extra material of the template that includes an opaque defect and repairing clear defects caused by the removal of the opaque defect in the template by a focused ion beam (FIB). The template may be exposed to a strongly basic solution to remove ion stains produced by the FIB.

Additional advantages and features of the present invention will be apparent from the following detailed description and drawings which illustrate preferred embodiments of the invention.

DETAILED DESCRIPTION OF PREFERRED EMBODIMENTS

Figure 1:
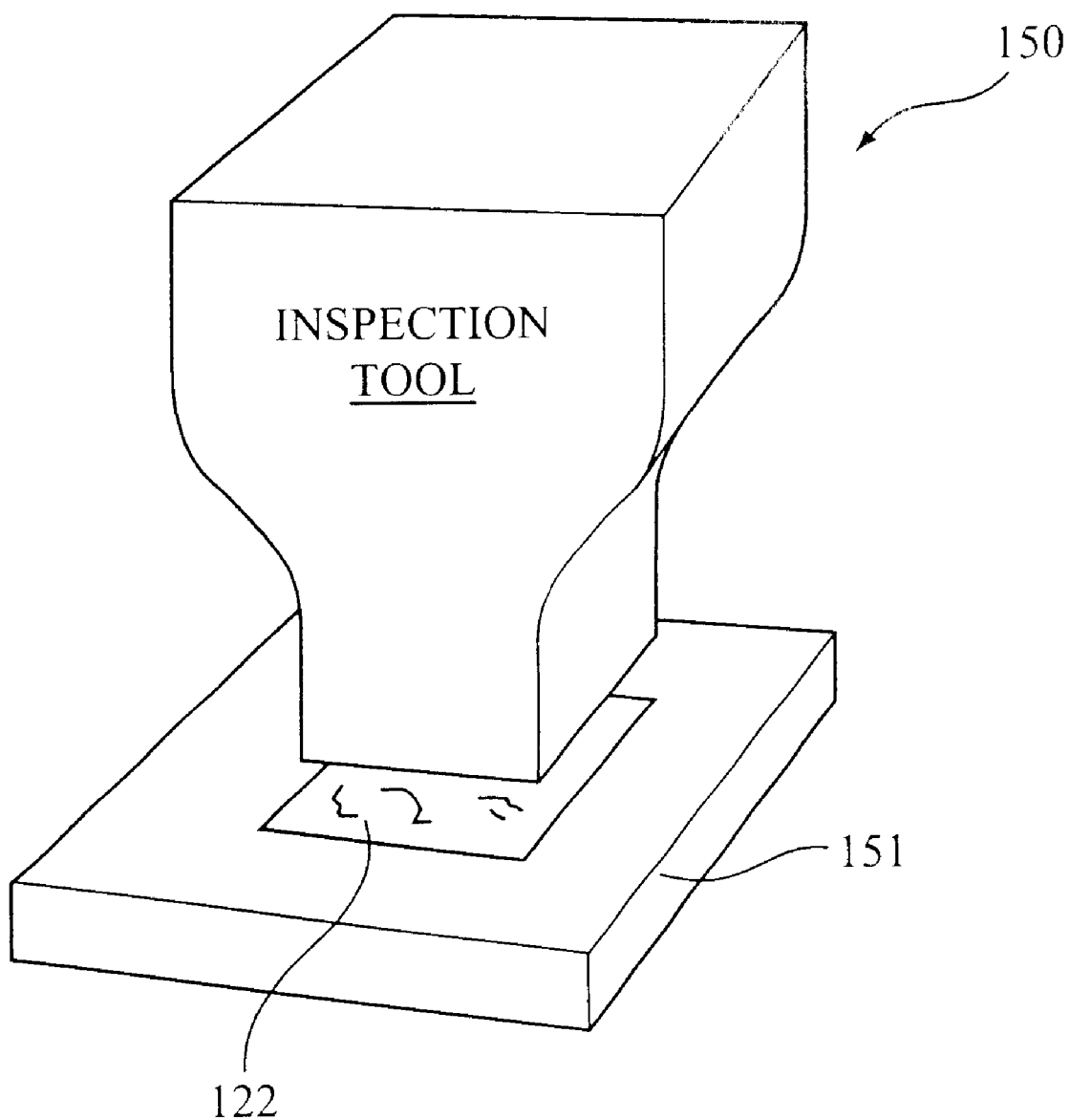
FIG. 1 is representative view of the lithographic template according the present invention undergoing a first step of the method of the invention.

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized, and that structural, logical and electrical changes may be made without departing from the spirit and scope of the present invention. It should be understood that with reference to the following drawings that like reference numbers represent like parts in the drawings.

A first embodiment of the present invention is explained with reference to FIG. 1. The sample 122 may be, for example, a photomask, a reticle, an X-ray mask or a semiconductor such as an IC or an LSI (large scale integrated circuit). Preferably, the sample 122 is a photomask comprising a transparent substrate of glass and a MoSi pattern film formed on the substrate. The mask 122 is inspected for defects by using a mask inspection tool, such as, for example, a KLA 351 inspection tool available from KLA Instruments Corporation, San Jose Calif. Mask inspection apparatus are known in the art. An exemplary mask inspection apparatus is described in U.S. Pat. No. 5,717,204 the contents of which are herein incorporated by reference. The mask inspection tool 150 scans the mask 122 at the selected wavelength and sensitivity to determine the features of the mask 122 and the classification of the defects. The mask 122 is mounted on an x-y stage 151 of the mask inspection tool 150. The exact locations of the opaque MoSi defects 160 are recorded relative to a predetermined reference point using the mask inspection tool 150.

Figure 2:
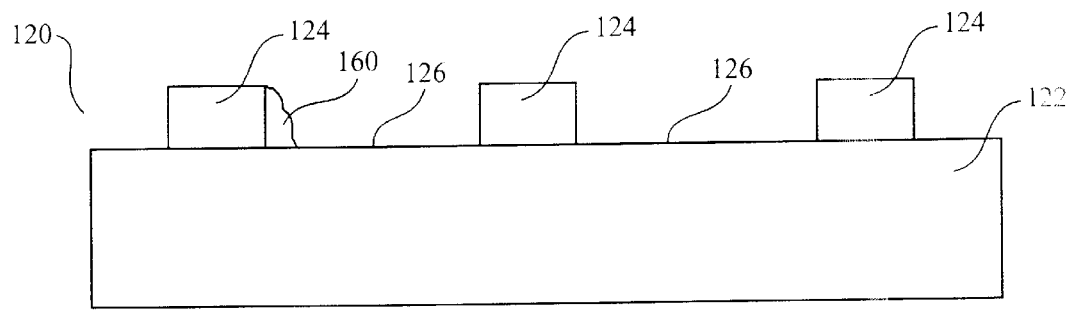
FIG. 2 is a side view of a lithographic template undergoing the process of a first embodiment of the invention.
Figure 3:
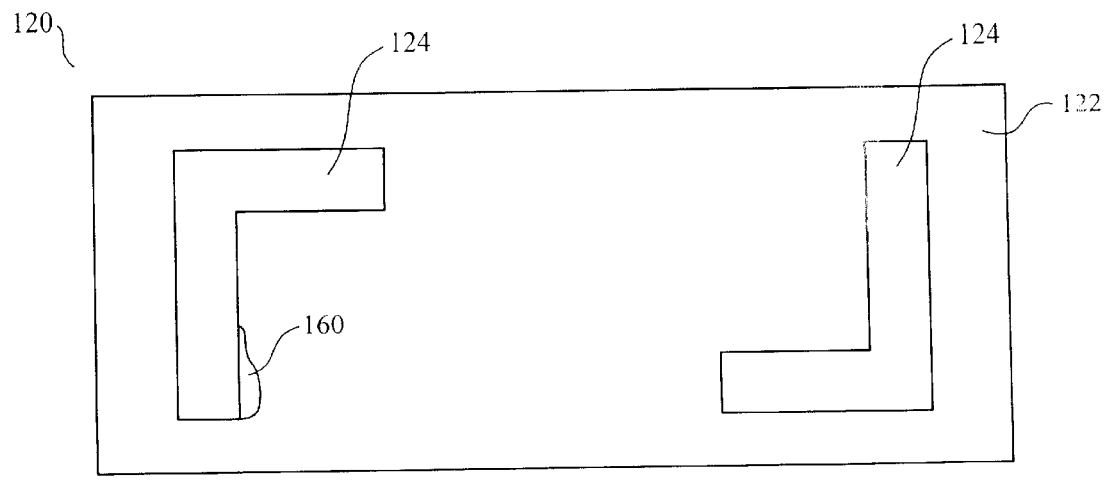
FIG. 3 is a top view of the template of FIG. 2.

The mask inspection tool 150 indicates the location of the opaque defect 160 on the mask 122, as shown for example in FIGS. 2 and 3. The transparent substrate 122 is made of silica glass, borosilicate glass, quartz, or the like, and is typically a 6 by 6 inch square having a thickness of approximately 0.25 inches, although the size and thickness may vary. The light translucent portion 124 typically comprises a thin film made of a material containing metal and silicon as its main components, and which may additionally contain oxygen or oxygen and nitrogen.

The thickness of the light translucent portion 124 is adjusted depending on the composition of the light translucent portion 124 so that phase shifting within the range of 160 to 200 degrees and light transmission within the range of 2 to 20 percent are achieved. Preferably, the phase shifting amount is 180 degrees and the light transmission is approximately 8 to 12 percent. At the preferred transmission levels, the light translucent portion 124 has both a light shielding function and a phase shifting function, obviating the need to separately form a light shielding film and a phase shifting film. The thickness of the light translucent portion 124 may be adjusted according to the equation:

$$d=(\phi/360)\times[\lambda/(n-1)]$$

where d is the thickness of the light translucent portion 124, $\phi$ is a predetermined phase shifting amount, $\lambda$ is the wavelength of light with which the lithographic template 120 will be used, and n is the refractive index of the material of the light translucent portion 124.

The light translucent portion 124 is formed of a metal film. The light translucent portion 124 may be formed of metals such as, molybdenum, tantalum, or tungsten, and the light translucent portion 124 may form a film such as a metal silicide, metal oxysilicide, metal oxynitrosilicide, or other similar compound. For exemplary purposes, the light translucent portion 124 is described as being a molybdenum silicide film. Additional films or opaque materials such as chromium-containing layers may be present on the template 120 as well.

Figure 4:
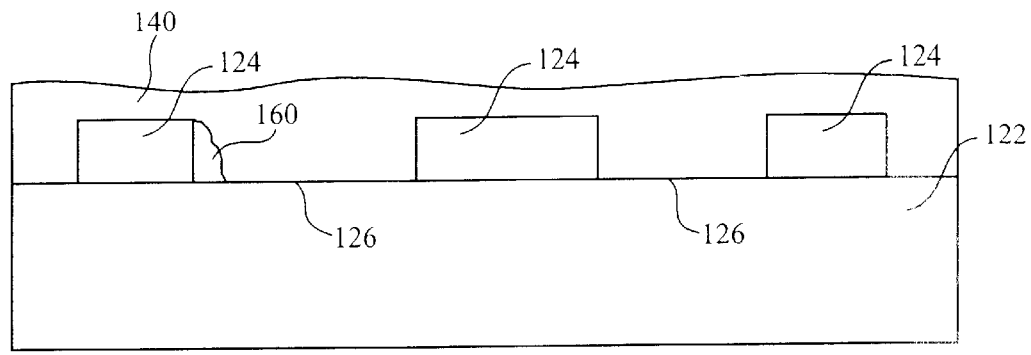
FIG. 4 illustrates the template of FIG. 2 at a processing step subsequent to that shown in FIGS. 2 and 3.

Reference is now made to FIG. 4. The mask 122 is cleaned and coated with a layer of resist 140. A standard optic microscope having an adjustable square shaped field aperture and the capability to select different wavelengths using band pass filters is used to locate the opaque defect 160 on the mask 122 in conjunction with the data obtained from the mask inspection tool 150. Preferably the optic microscope uses a yellow light filter to locate the defects on the mask 122. The defect is first located using the inspection information from the mask inspection tool 150 and the mask 122 is illuminated with a wavelength of light that is not sensitive to the resist, i.e., a wavelength of about 575 nm.

Once the opaque defect 160 is located, the filter on the optic microscope is changed and a wavelength of light that the resist 140 is sensitive to is selected. Preferably the wavelength that is sensitive to the resist 140 is in the ultraviolet range, preferably from about 355–375 nm, most preferably about 365 nm. The opaque defect 160 is then exposed to the light from the optic microscope. It is not necessary to exactly expose the area including the opaque defect 160, in fact, it is advantageous to the present invention to overexpose the area including the opaque defect 160. All that is required is that a large enough area is exposed to cover the opaque defect 160.

Figure 5:
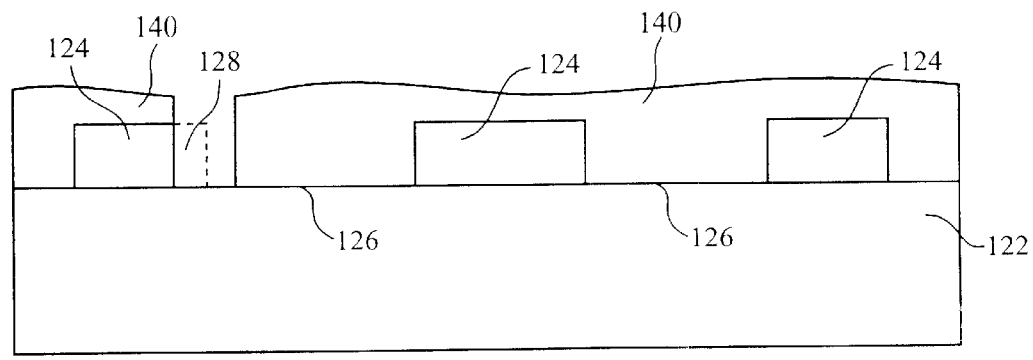
FIG. 5 illustrates the template of FIG. 2 at a processing step subsequent to that shown in FIG. 4.
Figure 6:
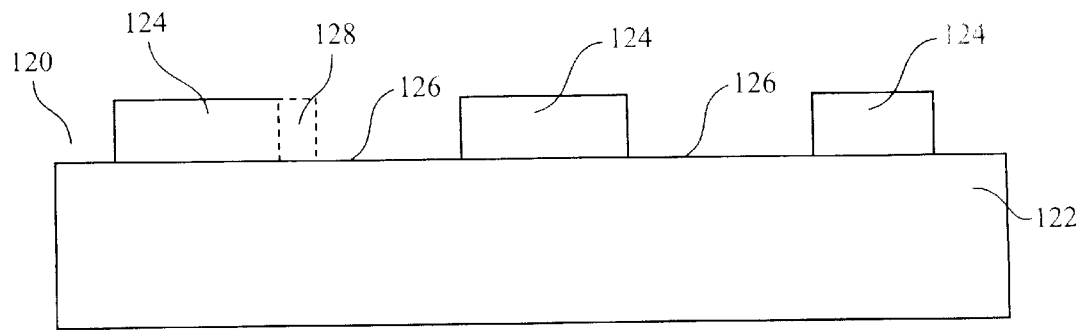
FIG. 6 illustrates the template of FIG. 2 at a processing step subsequent to that shown in FIG. 5.

Once the resist in the defect area is exposed and developed, the exposed MoSi area will be dry etched. Any suitable etchant may be used to remove the exposed MoSi area. Since the mask defect area 160 is overexposed, a clear defect 128 will be formed during dry etching in the translucent portion 124 as shown in FIG. 5. After defect dry etch, the resist is stripped and the mask 120 is shown in FIG. 6.

Figure 7:
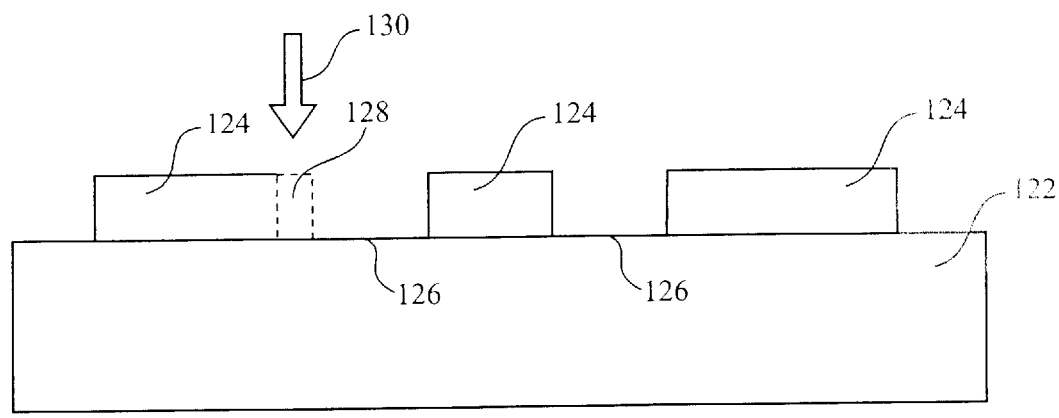
FIG. 7 illustrates the template of FIG. 2 at a processing step subsequent to that shown in FIG. 6.

Reference is now made to FIG. 7. A clear defect 128 is formed by the removal of the opaque defect 160 and this clear defect 128 must now be removed. To remove the clear defect 128, the template 120 is placed in the vacuum chamber (not shown) of a FIB system. Any suitable FIB system may be utilized, additionally, commercial embodiments are those such as a Seiko SIR-3000 system manufactured by Seiko Instrument Inc., or a Micrion 8000 system manufactured by Micrion, Inc. Such systems typically have an irradiation energy within the range of 25 to 30 KeV, and a beam current of approximately 45 to 300 pA.

Figure 8:
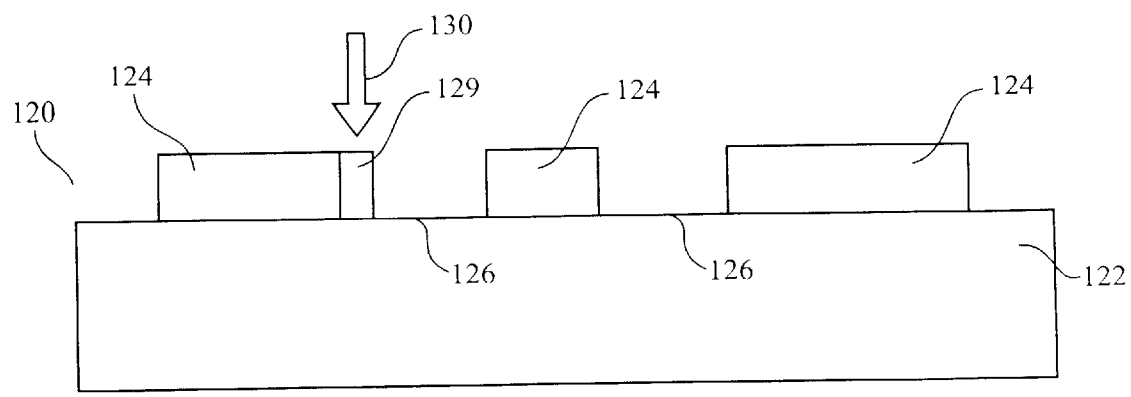
FIG. 8 illustrates the template of FIG. 2 at a processing step subsequent to that shown in FIG. 7.

Referring now to FIG. 8, the ion beam 130 is focused and scanned on the clear defect 128 while an organic gas is introduced into the reaction region and sputtering is begun. The clear defect 128 is then patched with a carbon film formed by the reaction of the organic gas to replace the clear defect 128 in the light translucent portion 124 with a carbon film layer 129.

Any remaining ion stains may then be removed by exposing the template 120 to an aqueous solution of a strong base if necessary. Suitable bases include sodium hydroxide, potassium hydroxide, ammonium hydroxide, tetramethyl ammonium hydroxide, and the like. Preferably sodium hydroxide is used. The solution should comprise approximately 3 to 4 percent sodium hydroxide in water, or should be of an equivalent strength if another base is used. The sodium hydroxide solution is heated to a temperature of approximately 80 degrees Celsius, and the template is exposed to this solution by wet etching such as immersion or spray etching, for a period of time within the range of approximately 1 to 5 minutes. Preferably the exposure time is approximately 2 minutes, but it should be understood that the exposure time will vary according to the strength of the basic solution utilized.

The method described above provides an easy, convenient and inexpensive way to repair phase shifting masks using currently available apparatus.

Figure 9:
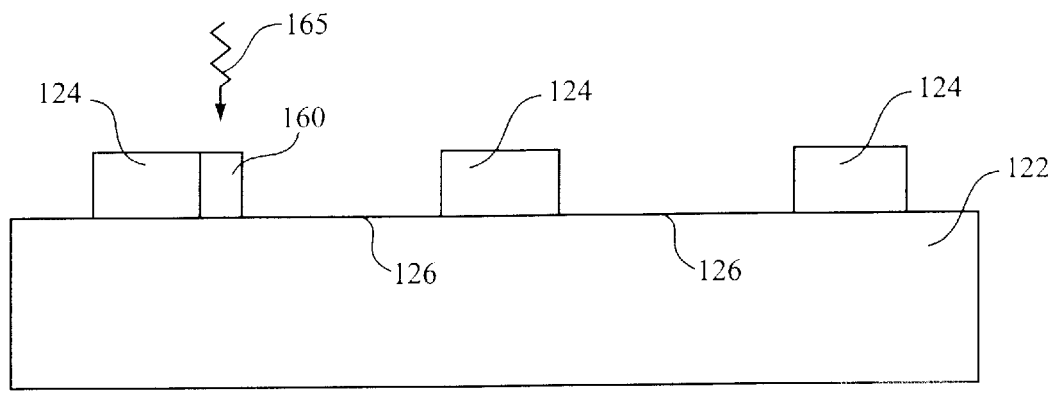
FIG. 9 is a side view of a lithographic template undergoing the process of a second embodiment of the invention.

Reference is now made to FIG. 9 which describes a second embodiment of the present invention. The mask 122 is inspected for defects by using a mask inspection tool as described above with reference to FIG. 1. The mask inspection tool 150 scans the mask 122 to determine the features of the mask 122 and the classification of the defects. The mask 122 is mounted on an x-y stage 151 of the mask inspection tool 150. The exact locations of the opaque defects 160 are recorded relative to a predetermined reference point using a mask inspection apparatus.

The mask 122 is then loaded onto a laser repair tool, such as, for example, the DRSII laser repair tool available from Quantronix, Inc. The opaque defect 160 is removed by ablating the defect with a laser beam 165 having a wavelength from about 530 to about 580 nm. Because of the poor image resolution of the laser repair tool, it is not necessary to calibrate the laser repair tool to focus on repair edge accuracy during this step. In fact, it is preferable that the laser tool remove an excess portion of the translucent portion 124 together with the opaque defect 160, thus generating a new clear defect 128.

Figure 10:
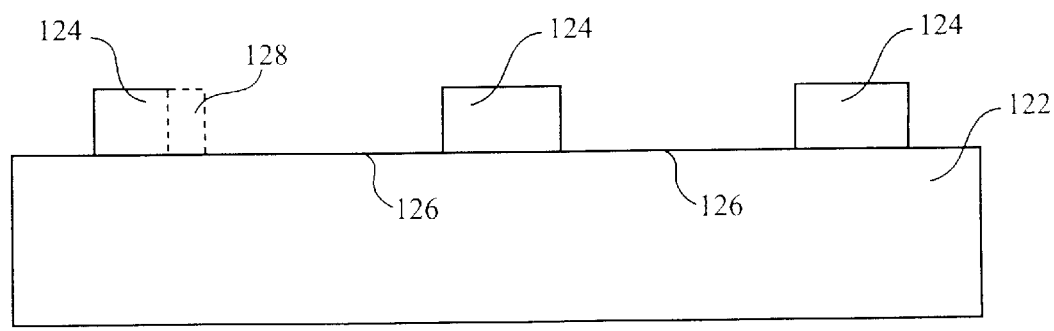
FIG. 10 illustrates the template of FIG. 9 at a processing step subsequent to that shown in FIG. 9.

Reference is now made to FIG. 10. The clear defect 128 formed in the removal of the opaque defect 160 must now be removed. To remove the clear defect 128, the template 120 is placed in the vacuum chamber (not shown) of a FIB system. Any suitable FIB system as described above may be utilized. Such systems typically have an irradiation energy within the range of 25 to 30 KeV, and a beam current of approximately 45 to 300 pA.

Figure 11:
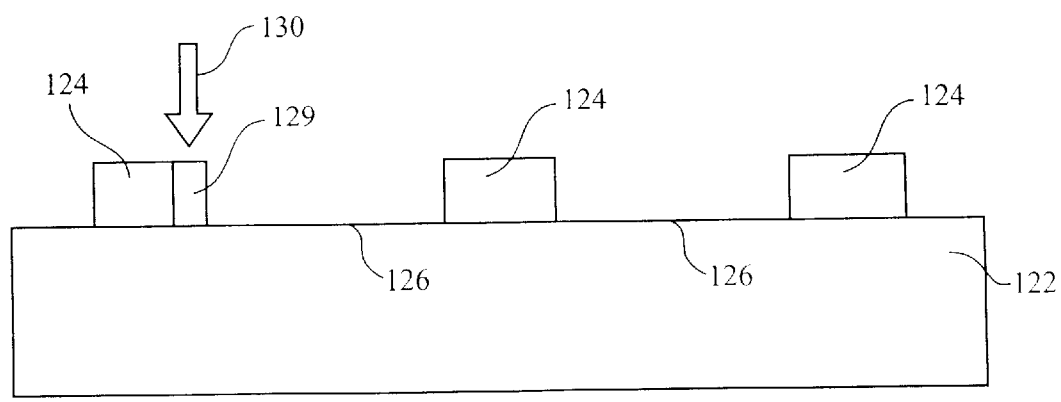
FIG. 11 illustrates the template of FIG. 9 at a processing step subsequent to that shown in FIG. 10.

Referring now to FIG. 11, the ion beam 130 is focused and scanned on the clear defect 128 while an organic gas is introduced into the reaction chamber and sputtering is begun. The clear defect 128 is then patched with a carbon film formed by the reaction of the organic gas to replace the clear defect 128 in the light translucent portion 124 with a carbon film layer 129.

Any remaining ion stains may then be removed by exposing the template 120 to an aqueous solution of a strong base if necessary. Suitable bases include sodium hydroxide, potassium hydroxide, ammonium hydroxide, tetramethyl ammonium hydroxide, and the like. Preferably sodium hydroxide is used. The solution should comprise approximately 3 to 4 percent sodium hydroxide in water, or should be of an equivalent strength if another base is used. The sodium hydroxide solution is heated to a temperature of approximately 80 degrees Celsius, and the template is exposed to this solution by wet etching such as immersion or spray etching, for a period of time within the range of approximately 1 to 5 minutes. Preferably the exposure time is approximately 2 minutes, but it should be understood that the exposure time will vary according to the strength of the basic solution utilized.

The method described above provides an easy, convenient and inexpensive way to repair phase shifting masks using currently available apparatus.

The above description and drawings illustrate preferred embodiments which achieve the objects, features and advantages of the present invention. It is not intended that the present invention be limited to the illustrated embodiments. The detailed description is, therefore, not to be taken in a limiting sense, and the scope of the present invention is defined by the appended claims. Any modification of the present invention which comes within the spirit and scope of the following claims should be considered part of the present invention.

What is claimed as new and desired to be protected by Letters Patent of the United States is:

1. A method for removing an opaque defect from a lithographic template comprising:
   providing a lithographic template having a substrate layer and a patterned molybdenum silicide layer on the substrate layer;
   identifying the opaque defect on said lithographic template by scanning said lithographic template with an optical inspection tool;
   coating said lithographic template with a layer of resist;
   viewing said identified opaque defect under said layer of resist through a microscope using a yellow light filter to verify the location of said opaque defect;

exposing an area of said lithographic template which contains and is larger than said opaque defect to ultraviolet light;

developing said resist;

removing said opaque defect by dry etching;

stripping the remaining resist after said opaque defect removal;

repairing a clear defect formed when said opaque defect is removed by depositing a carbon film on the clear defect and by exposing said clear defect to a focused ion beam; and exposing said lithographic template to a sodium hydroxide solution after said clear defect removal to remove ion staining caused by said focused ion beam.

2. A method for removing an opaque defect from a lithographic template comprising:

providing a lithographic template having a substrate layer and a patterned molybdenum silicide layer on the substrate layer;

identifying the opaque defect on said lithographic template by scanning said lithographic template with an optical inspection tool;

coating said lithographic template with a layer of resist;

viewing said identified opaque defect under said layer of resist through a microscope using a yellow light filter to verify the location of said opaque defect;

exposing an area of said lithographic template which contains and is larger than said opaque defect to ultraviolet light;

developing said resist;

removing said opaque defect by dry etching;

stripping the remaining resist after said opaque defect removal;

repairing a clear defect formed when said opaque defect is removed by depositing a carbon film on the clear defect and by exposing said clear defect to a focused ion beam; and exposing said lithographic template to an aqueous solution containing at least one of potassium hydroxide, ammonium hydroxide and tetramethyl ammonium hydroxide.

* * * * *